United States Patent
Ng et al.

(10) Patent No.: US 11,418,002 B2
(45) Date of Patent: Aug. 16, 2022

(54) ELECTRONIC PACKAGE AND METHOD FOR FABRICATING THE SAME

(71) Applicant: Siliconware Precision Industries Co., Ltd., Taichung (TW)

(72) Inventors: Kong-Toon Ng, Taichung (TW); Yi-Chian Liao, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 469 days.

(21) Appl. No.: 16/669,796

(22) Filed: Oct. 31, 2019

(65) Prior Publication Data
US 2021/0066883 A1    Mar. 4, 2021

(30) Foreign Application Priority Data
Aug. 30, 2019    (TW) .................. 108131322

(51) Int. Cl.
| | | |
|---|---|---|
| *G01N 21/17* | (2006.01) | |
| *H01S 5/02234* | (2021.01) | |
| *H01L 23/538* | (2006.01) | |
| *H01L 23/00* | (2006.01) | |
| *H01L 21/683* | (2006.01) | |
| *H01L 21/48* | (2006.01) | |
| *H01L 21/56* | (2006.01) | |
| *H01L 23/31* | (2006.01) | |

(Continued)

(52) U.S. Cl.
CPC ...... *H01S 5/02234* (2021.01); *H01L 21/4853* (2013.01); *H01L 21/4857* (2013.01); *H01L 21/565* (2013.01); *H01L 21/568* (2013.01); *H01L 21/6835* (2013.01); *H01L 23/3128* (2013.01); *H01L 23/5383* (2013.01); *H01L 23/5386* (2013.01); *H01L 23/5389* (2013.01); *H01L 24/19* (2013.01); *H01L 24/20* (2013.01); *H01S 5/02355* (2021.01); *H01L 2221/68372* (2013.01); *H01L 2224/214* (2013.01); *H01L 2924/12042* (2013.01); *H01L 2924/1426* (2013.01); *H04B 10/503* (2013.01)

(58) Field of Classification Search
CPC ............. H01L 21/4853; H01L 21/4857; H01L 21/565; H01L 21/568; H01L 21/6835; H01L 23/3028; H01L 23/5383; H01L 23/5389; H01L 24/19; H01L 24/20; H01L 2221/68372; H01L 2224/214; H01L 2924/12042; H01L 2924/1426; H04B 10/503; H01S 5/02234; H01S 5/02355
USPC ....................................................... 250/216
See application file for complete search history.

(56) References Cited

U.S. PATENT DOCUMENTS

| | | | | |
|---|---|---|---|---|
| 11,004,827 B2 * | 5/2021 | Hsieh | ................ | H01L 21/6835 |
| 2019/0237374 A1 * | 8/2019 | Huang | ................ | H01L 23/3114 |

* cited by examiner

*Primary Examiner* — Luan C Thai
(74) *Attorney, Agent, or Firm* — Hsuanyeh Law Group PC

(57) ABSTRACT

An electronic package and a method for fabricating an electronic package are provided. An encapsulation layer encapsulates a first electronic component and a plurality of conductive pillars, and is defined with a reservation region and a removal region adjacent to the reservation region. A circuit structure is disposed on the encapsulation layer. The removal region and the circuit structure therewithin are removed for an optical communication element to protrude from a lateral surface of the encapsulation layer when the optical communication element is disposed on the circuit structure, so as to avoid a packaging material used in a subsequent process from being adhered to a protruding portion of the optical communication element.

20 Claims, 6 Drawing Sheets

(51) Int. Cl.
*H01S 5/02355* (2021.01)
*H04B 10/50* (2013.01)

US 11,418,002 B2

ELECTRONIC PACKAGE AND METHOD FOR FABRICATING THE SAME

CROSS-REFERENCE TO RELATED APPLICATIONS

This application claims priority to Taiwan Application Serial No. 108131322, filed on Aug. 30, 2019. The entirety of the application is hereby incorporated by reference herein and made a part of this specification.

BACKGROUND

1. Technical Field

The present disclosure relates to semiconductor packaging structures, and, more particularly, to an electronic package and a method for fabricating the same.

2. Description of the Prior Art

With the rapid development of electronic industry, electronic products are fabricated to have various functions of high performance. In order to meet the miniaturization packaging standard required by an electronic package, a wafer level packaging (WLP) technique was brought to the market.

FIGS. 1A to 1E are cross-sectional views illustrating a method for fabricating a semiconductor package 1 by employing a wafer-level packaging technique according to the prior art.

As shown in FIG. 1A, a thermal release layer 100 is formed on a carrier 10.

Then, a plurality of communication chips 11 are disposed on the thermal release layer 100. Each of the communication chips 11 has an active surface 11a, an inactive surface 11b opposing the active surface 11a, and a plurality of electrode pads 110 disposed on the active surface 11a, and the active surface 11a of the communication chip 11 is adhered to the thermal release layer 100.

As shown in FIG. 1B, a packaging resin 14 is formed on the thermal release layer 100 and encapsulates the communication chips 11.

As shown in FIG. 1C, the thermal release layer 100 is baked and cured, and the thermal release layer 100 and the carrier 10 are removed to expose the active surface 11a of the communication chips 11.

As shown in FIG. 1D, a circuit structure 16 is disposed on the packaging resin 14 and the active surface 11a of the communication chips 11, and electrically connected to the electrode pads 110. Then, an insulation protection layer 18 is formed on the circuit structure 16, and a portion of a surface of the circuit structure 16 is exposed from the insulation protection layer 18 for conductive elements 17, such as solder balls, to be bonded thereto.

As shown in FIG. 1E, a singulation process is performed along a cutting path L shown in FIG. 1D, and a plurality of semiconductor packages 1 are thus obtained.

However, if applied to a network switch, a transmission function of the semiconductor package 1 will be affected by a polishing force in a polishing process, and is thus degraded.

As a data network is scaled to meet the ever-increasing bandwidth demands, a copper data channel (e.g., a circuit of the circuit structure 16) has significant drawbacks, including signal attenuation and cross-talk caused by radiation electromagnetic energy among the communication chips 11.

Balancing, encoding and shielding techniques may be used to reduce signal attenuation and cross-talk. However, such techniques consume significantly great power, are complex, will loss cable capacity, improve the suitability of a local region only, and has limited scalability.

Therefore, how to overcome the problems of the prior art is becoming an urgent issue in the art.

SUMMARY

In view of the problems of the prior art, the present disclosure provides an electronic package, comprising: an encapsulation layer having a first surface, a second surface opposing the first surface, and a lateral surface adjacent to the first surface and the second surface; a first electronic component embedded in the encapsulation layer; a plurality of conductive pillars embedded in the encapsulation layer; a circuit structure disposed on the first surface of the encapsulation layer and electrically connected to the conductive pillars and the first electronic component; and an optical communication element disposed on the circuit structure, electrically connected to the circuit structure, and having an opto-electronic part and a laser part.

In an embodiment, the electronic package further comprises a circuit part disposed on the second surface of the encapsulation layer and electrically connected to the conductive pillars.

The present disclosure further provides a method for fabricating an electronic package, comprising: encapsulating a first electronic component and a plurality of conductive pillars with an encapsulation layer that has a first surface and a second surface opposing the first surface and is defined with a reservation region, within which the first electronic component and a portion of the conductive pillars are disposed, and a removal region adjacent to the reservation region, within which a remaining of the conductive pillars are disposed; disposing a circuit structure on the first surface of the encapsulation layer and electrically connecting the circuit structure to the conductive pillars and the first electronic component; disposing a circuit part on the second surface of the encapsulation layer, and electrically connecting the circuit part to the conductive pillars; removing the removal region and the circuit structure and the circuit part therewithin, and forming a lateral surface of the encapsulation layer adjacent to the first surface and the second surface; and disposing on the circuit structure an optical communication element having an opto-electronic part and a laser part, and electrically connecting the optical communication element to the circuit structure.

In an embodiment, the plurality of conductive pillars surround the first electronic component before removing the removal region.

In an embodiment, the first electronic component is bonded and electrically connected to a plurality of conductors.

In an embodiment, the opto-electronic part converts an optical signal into an electric signal, and the laser part converts the electric signal into another optical signal and emits the another optical signal. In another embodiment, the optical communication element is electrically connected to the circuit structure via a plurality of conductive bumps that are disposed outside the laser part. In yet another embodiment, the method further comprises packaging the plurality of conductive bumps with a packaging material that is not formed on the laser part.

In an embodiment, the optical communication element has a protruding portion protruding from the lateral surface of the encapsulation layer and acting as a connecting segment.

In an embodiment, the method further comprises disposing a plurality of conductive elements on the circuit part.

In an embodiment, the method further comprises disposing a carrier structure on the second surface of the encapsulation layer. In another embodiment, the method further comprises disposing a second electronic component on the carrier structure.

In the electronic package and the method for fabricating the same according to the present disclosure, the encapsulation layer is formed first, and then the optical communication element is disposed, so as to avoid a polishing process from affecting the optical communication element. The removal of the removal region and the circuit structure and the circuit part therewithin allows the optical communication element to protrude from the lateral surface of the encapsulation layer effectively and prevents a packaging material used in a subsequent process from being adhered to the connecting segment. Therefore, the packaging material will not affect the optical signal transmission of the connecting segment.

In an embodiment, the opto-electronic part and the laser part are integrated into a single optical communication element, so as to eliminate the signal attenuation and crosstalk caused by radiation electromagnetic energy between the opto-electronic part and the laser part if they are separated from each other, thereby improving the suitability and scalability of the electronic package as a whole.

BRIEF DESCRIPTION OF THE DRAWINGS

FIG. 2A' is a top view of a portion of FIG. 2A;

FIG. 2F' is a bottom view of a cross section of a portion of FIG. 2F; and

DETAILED DESCRIPTION

Figure 1A:
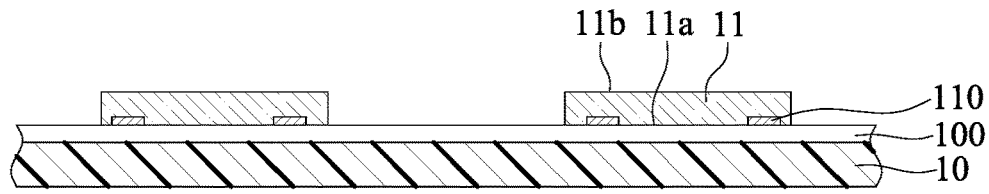
FIGS. 1A to 1E are cross-sectional views illustrating a method for fabricating a semiconductor package according to the prior art.
Figure 1B:
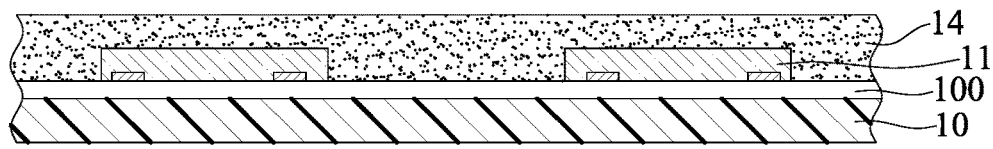
Figure 1C:
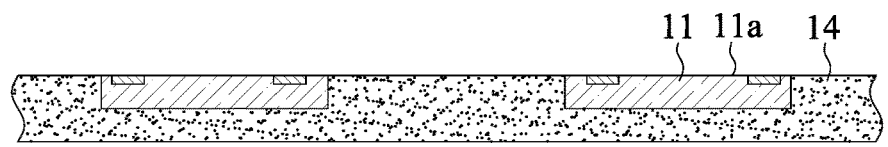
Figure 1D:
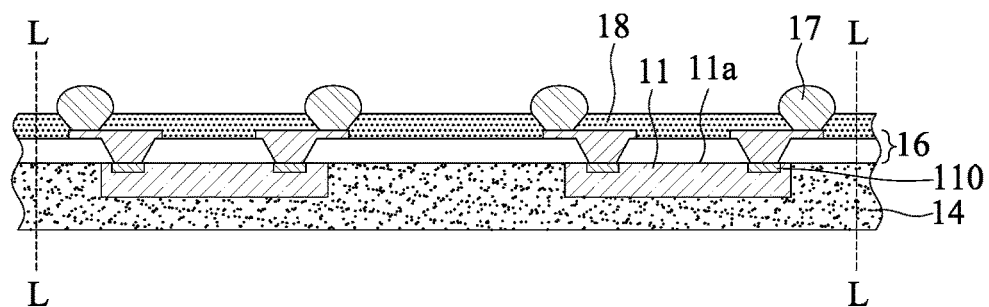
Figure 1E:
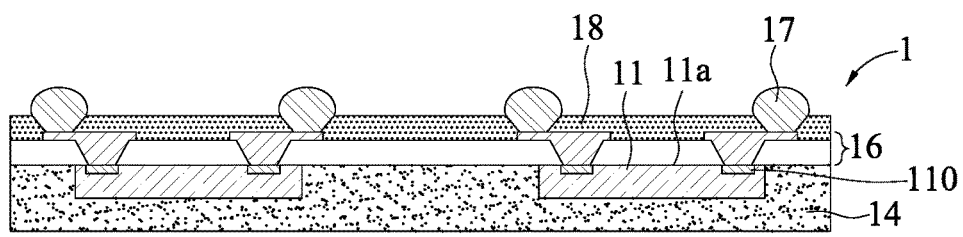

The following illustrative embodiments are provided to illustrate the present disclosure, these and other advantages and effects can be apparently understood by those in the art after reading the disclosure of this specification.

It should be noted that the structures, ratios, sizes shown in the drawings appended to this specification are to be construed in conjunction with the disclosure of this specification in order to facilitate understanding of those skilled in the art. They are not meant, in any ways, to limit the implementations of the present disclosure, and therefore have no substantial technical meaning. Without affecting the effects created and objectives achieved by the present disclosure, any modifications, changes or adjustments to the structures, ratio relationships or sizes, are to be construed as fall within the range covered by the technical contents disclosed herein. Meanwhile, terms, such as "above", "below," "first", "second", "a", and the like, are for illustrative purposes only, and are not meant to limit the range implementable by the present disclosure. Any changes or adjustments made to their relative relationships, without modifying the substantial technical contents, are also to be construed as within the range implementable by the present disclosure.

FIGS. 2A to 2F are cross-sectional views illustrating a method for fabricating an electronic package 2 according to the present disclosure.

Figure 2A:
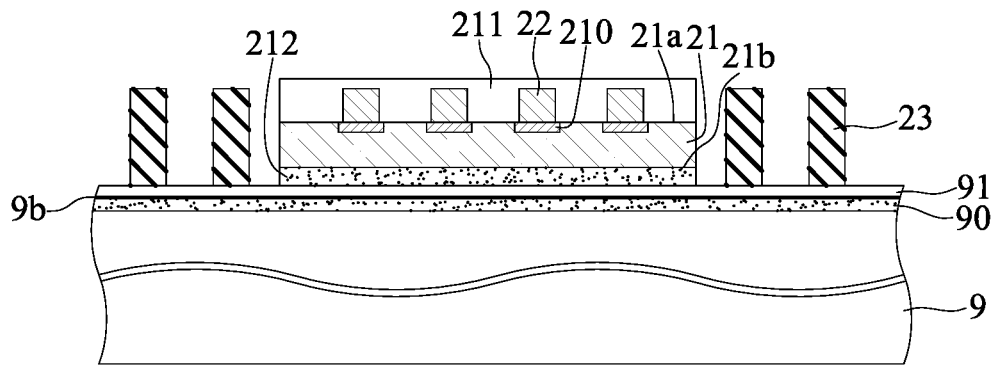
FIGS. 2A to 2F are cross-sectional views illustrating a method for fabricating an electronic package according to the present disclosure.
Figure 2A:
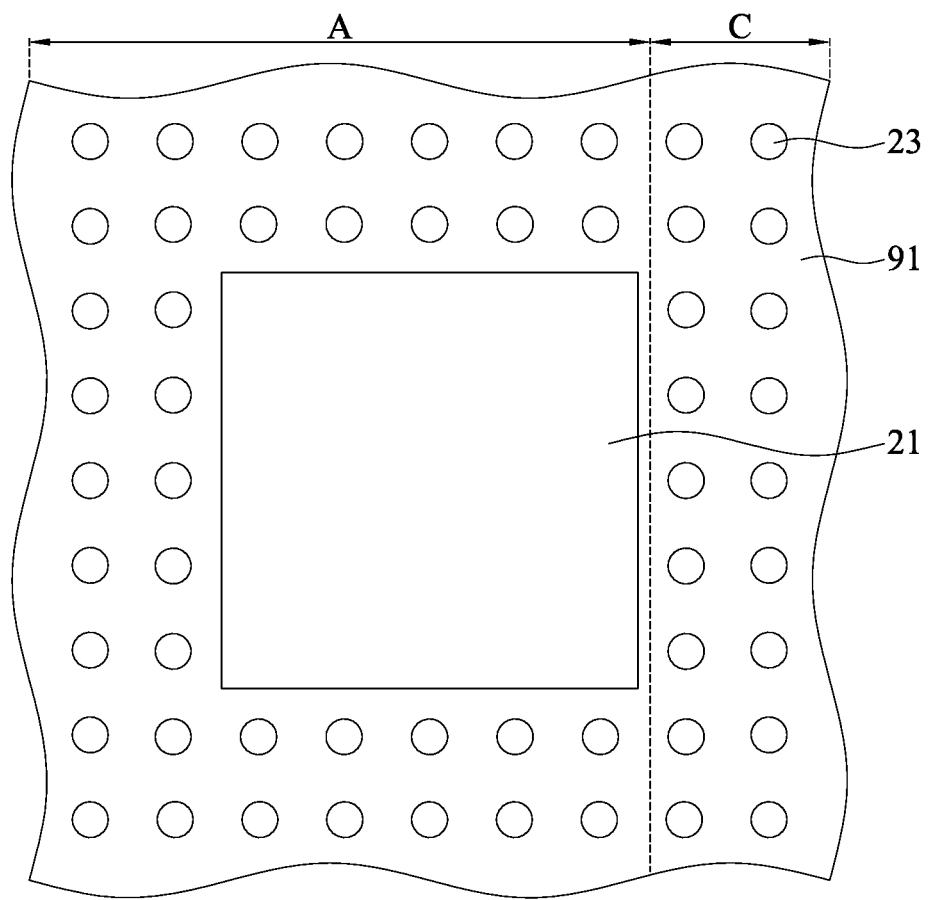

As shown in FIG. 2A, a plurality of conductive pillars 23 and at least one first electronic component 21 are disposed on a carrier board 9, and a plurality of conductors 22 are bonded and electrically connected to the first electronic component 21.

In an embodiment, the carrier board 9 is a board made of a semiconductor material, such as silicon or glass, a release layer 90, a metal layer 9b (e.g., titanium/copper), and an insulation layer 91 made of a dielectric material or a solder mask material are applied on the carrier board 9 sequentially, and the conductive pillars 23 are disposed on the insulation layer 91.

In an embodiment, the conductive pillars 23 are made of metal (e.g., copper) or a solder, and the conductors 22 are conductive circuits, in the shape of round balls, such as solder balls, in the shape of metal pillars, such as copper pillars and solder bumps, or stud conductive elements fabricated by a wire bonder.

In an embodiment, the first electronic component 21 is an active element, such as a semiconductor chip, a passive element, such as a resistor, a capacitor and an inductor, or a combination thereof. In an embodiment, the first electronic component 21 is a semiconductor chip that acts as a driver, and has an active surface 21a and an inactive surface 21b opposing the active surface 21a. The inactive surface 21b of first electronic component 21 is adhered via a bonding layer 212 to the insulation layer 91, a plurality of electrode pads 210 and a protection film 211 made of a passivation material are disposed on the active surface 21a, and the conductors 22 are disposed in the protection film 211.

The plurality of conductive pillars 23 surround the first electronic component 21, as shown in FIG. 2A'.

Figure 2B:
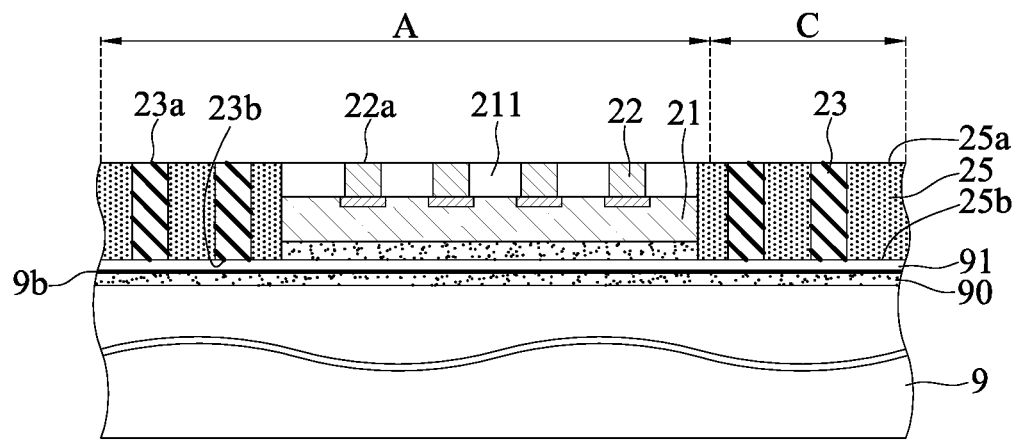

As shown in FIG. 2B, an encapsulation layer 25 is formed on the insulation layer 91 of the carrier board 9 and encapsulates the first electronic component 21, the conductors 22 and the conductive pillars 23. The encapsulation layer 25 has a first surface 25a and a second surface 25b opposing the first surface 25a. The second surface 25b of the encapsulation layer 25 is bonded to the insulation layer 91 of the carrier board 9. The protection film 211, end surfaces 22a of the conductors 22, and end surfaces 23a of the conductive pillars 23 are exposed from the first surface 25a of the encapsulation layer 25.

In an embodiment, the encapsulation layer 25 is defined with a reservation region A and a removal region C adjacent to the reservation region A, the first electronic component 21 and a portion of the conductive pillars 23 are within the reservation region A, and a remaining of the conductive pillars 23 is within the removal region C.

In an embodiment, the encapsulation layer 25 is made of an insulation material, such as polyimide (PI), a dry film, a packaging resin, such as epoxy, or a packaging material (a molding compound). In another embodiment, the encapsulation layer 25 is formed on the insulation layer 91 by a liquid compound, injection, lamination, or compression molding.

In a leveling process, the first surface 25a of the encapsulation layer 25 is processed to be flush with the protection film 211, the end surfaces 23a of the conductive pillars 23, and the end surfaces 22a of the conductors 22, and the end surfaces 23a of the conductive pillars 23 and the end surfaces 22a of the conductors 22 are exposed from the first surface 25a of the encapsulation layer 25. In an embodiment, a portion of the protection film 211, a portion of the conductive pillars 23, a portion of the conductors 22, and a portion of the encapsulation layer 25 are polished in the leveling process.

Another end surfaces 23b of the conductive pillars 23 are also flush with the second surface 25b of the encapsulation layer 25.

Figure 2C:
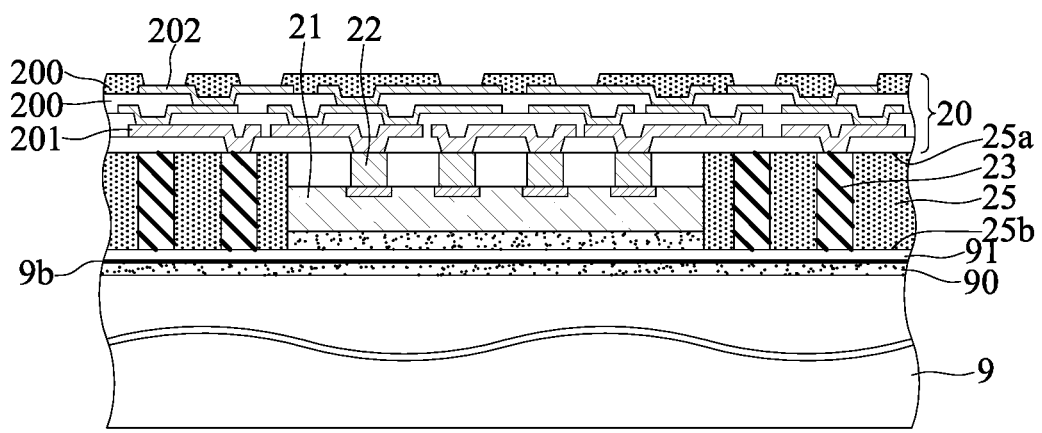

As shown in FIG. 2C, a circuit structure 20 is disposed on the first surface 25a of the encapsulation layer 25 and electrically connected to the conductive pillars 23 and the conductors 22.

In an embodiment, the circuit structure 20 comprises a plurality of insulation layers 200 and a plurality of redistribution layers (RDLs) 201 formed on the insulation layers 200. The outermost one of the insulation layers 200 acts as a solder mask layer. The outermost one of the redistribution layers 201 is exposed from the solder mask layer and acts as a conductive pad 202. In another embodiment, the circuit structure 20 has a single insulation layer 200 and a single redistribution layer 201.

In an embodiment, the redistribution layers 201 are formed by copper, and the insulation layers 200 are formed by a dielectric material, such as polybenzoxazole (PBO), polyimide (PI), prepreg (PP) etc., or a solder mask material, such as solder mask, solder resist etc.

Figure 2D:
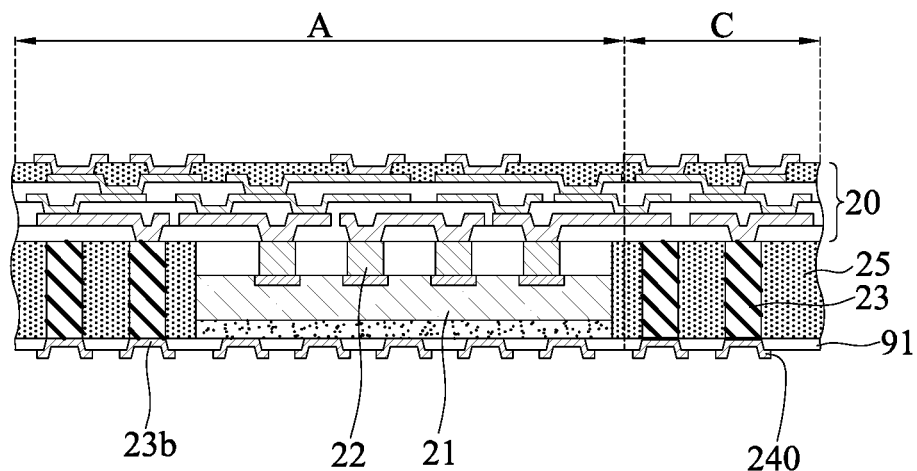

As shown in FIG. 2D, the carrier board 9 and the release layer 90 and the metal layer 9b thereon are removed, the insulation layer 91 remains, and a circuit part 240 is disposed on the insulation layer 91 and electrically connected to the conductive pillars 23.

In an embodiment, the insulation layer 91 is formed with a plurality of openings by laser, and the end surfaces 23b of the conductive pillars 23 and a portion of the second surface 25b of the encapsulation layer 25 are exposed from the openings, for the circuit part 240 to be bonded thereto. In an embodiment, the circuit part 240 is under-bump metallurgy (UBM), for a plurality of conductive elements, such as solder bumps or solder balls, to be bonded thereto. In another embodiment, a circuit part 240 is disposed on the insulation layer 91 in an RDL process, for the conductive elements or UBMs to be bonded thereto. In yet another embodiment, the circuit part 240 has other types.

By providing the carrier board 9 having the insulation layer 91, after the carrier board 9 is removed, the insulation layer 91 can be used to form the circuit part 240, and no dielectric layer needs to be formed. Therefore, the fabrication time and steps are saved, and the fabrication cost is reduced.

Figure 2E:
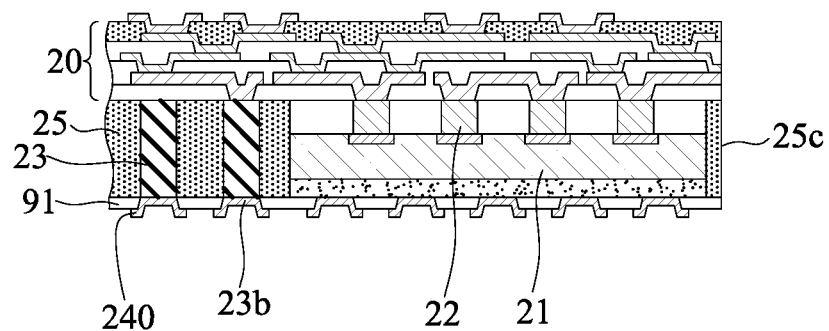

As shown in FIG. 2E, the removal region C and the circuit structure 20, the insulation layer 91 and the circuit part 240 therewithin are removed, and the encapsulation layer 25 is formed with a lateral surface 25c adjacent to the first surface and the second surface.

Figure 2F:
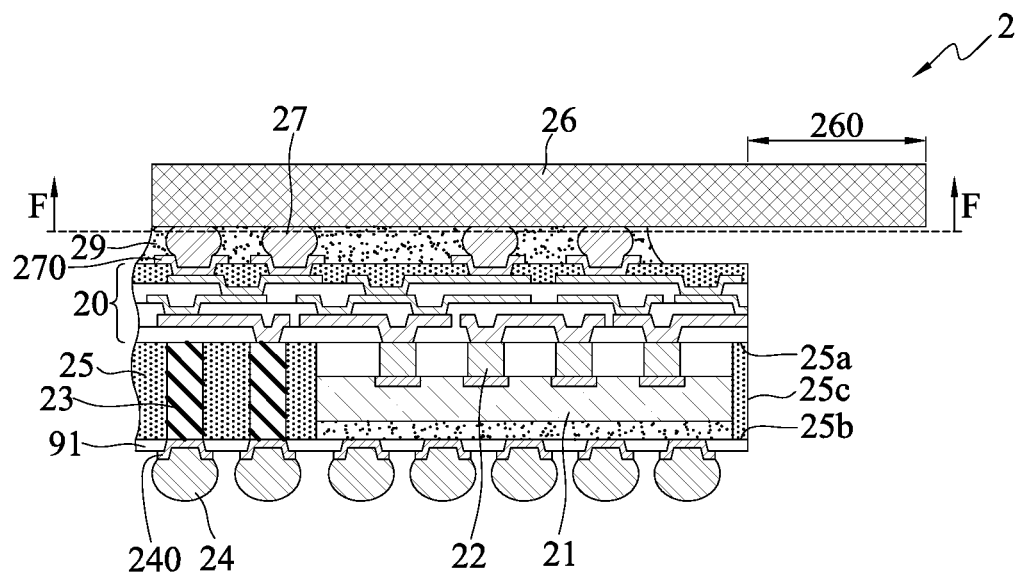
Figure 2F:
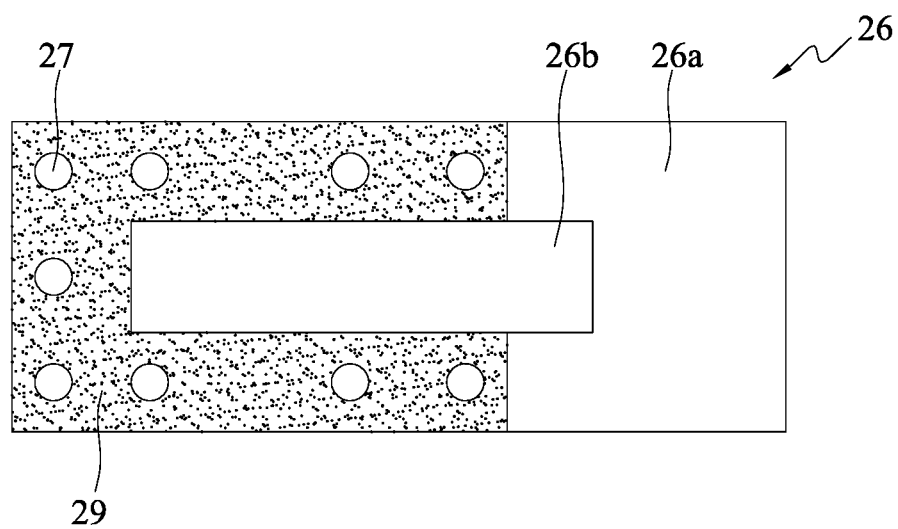

As shown in FIG. 2F, at least one optical communication element 26 is disposed on the circuit structure 20, and has a protruding portion that protrudes from the lateral surface 25c of the encapsulation layer 25 and acts as a connecting segment 260, for a bus having bus lines (e.g., fiber) to be connected thereto. A plurality of conductive elements 24, such as solder bumps or solder balls, are bonded to the circuit part 240.

In an embodiment, the optical communication element 26 is a multi-functional integrated chip, and has an opto-electronic part 26a, such as a photo diode, that converts an optical signal into an electric signal, and a laser part 26b, such as a laser diode, as shown in FIG. 2F', that converts the electric signal into an optical signal and emits the optical signal, such as a laser beam.

The optical communication element 26 is electrically connected via a plurality of conductive bumps 27, such as solder bumps, copper bumps etc., to the conductive pad 202. In an embodiment, an under-bump metallurgy (UBM) 270 is formed on the conductive pad 202, for the conductive bumps 27 to be bonded thereto.

A packaging material 29, such as an underfill, is formed between the circuit structure 20 and the optical communication element 26 and encapsulates the conductive bumps 27.

As shown in FIG. 2F', which corresponds to a bottom view of a cross section F-F of a portion of FIG. 2F, the plurality of conductive bumps 27 are disposed outside the laser part 26b, and the packaging material 29 is not formed on the laser part 26b. Therefore, the packaging material 29 will not affect the optical signal transmission of the laser part 26b.

In the operation of the electronic package 2, the driver (the first electronic component 21) drives the optical communication element 26, the connecting segment 260 of the optical communication element 26 receives an optical signal of a fiber (not shown), and the opto-electronic part 26a converts the optical signal into an electric signal. The circuit structure 20 and the laser part 26b convert the electric signal into another optical signal, and the laser part 26b emits the another optical signal to a target device (not shown).

When the electronic package 2 is applied to a network switch, since the optical communication element 26 has the laser part 26b and is highly susceptive to an ambient stress, according to the present disclosure, the encapsulation layer 25 is polished first (as shown in FIG. 2B), and then the optical communication element 26 is disposed (as shown in FIG. 2F). Therefore, the optical communication element 26 will not be affected by the polishing process.

In the method for fabricating the electronic package according to the present disclosure, the encapsulation layer 25 is defined with the removal region C. The connecting segment 260 of the optical communication element 26 protrudes from the lateral surface 25c of the encapsulation layer 25 effectively, after the removal region C and the circuit structure 20, the insulation layer 91 and the circuit part 240 thereon are removed. Therefore, a packaging material 29 used in a subsequent process will neither be adhered to the connecting segment 260, nor affect the optical signal transmission of the connecting segment 260.

The opto-electronic part 26a and the laser part 26b are integrated into a single optical communication element 26, to avoid the signal attenuation and cross-talk caused by radiation electromagnetic energy between the opto-electronic part 26a and the laser part 26b if they are separated from each other, and improve the suitability and scalability of the electronic package 2.

No balancing, encoding and shielding techniques are employed in the present disclosure, and the problems that a significantly great power is consumed, the circuit is complex, and cable capacity will be lost will not occur.

Figure 3:
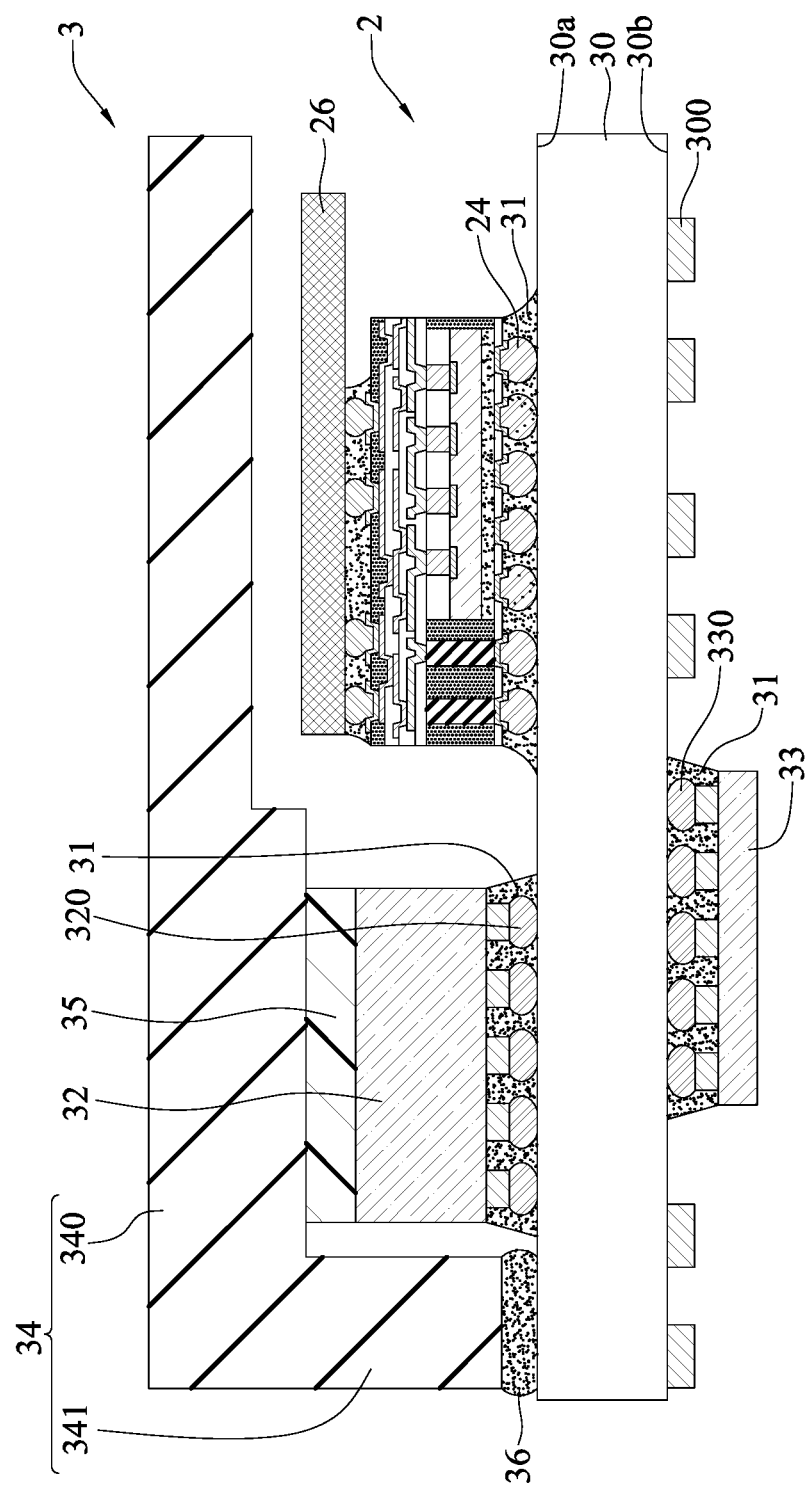
FIG. 3 is a cross-sectional view of an electronic package of another embodiment according to the present disclosure.

As shown in FIG. 3, the conductive elements 24 are disposed on a carrier structure 30, to form another electronic package 3.

In an embodiment, the carrier structure 30 is in the form of a substrate and has an upper surface 30a and a lower surface 30b opposing the upper surface 20a, and the electronic package 2 is disposed on the upper surface 30a of the carrier structure 30. In an embodiment, the carrier structure 30 is a packaging substrate having a core layer and a circuit structure, or a coreless circuit structure. In another embodiment, the circuit structure comprises at least one insulation layer and at least one circuit layer, such as at least one fan out redistribution layer, bonded to the insulation layer. In yet another embodiment, the carrier structure 30 is a lead frame, a wafer, or a carrier board having metal routing, but not limited thereto.

The conductive elements 24 is electrically connected to the carrier structure 30, and an underfill 31 encapsulates the conductive elements 24.

The carrier structure 30 is provided with at least one second electronic component 32, a third electronic component 33 and/or a heat sink 34.

The second electronic component 32 is disposed on the upper surface 30a of the carrier structure 30. In an embodiment, the second electronic component 32 is an active element, such as a semiconductor chip, a passive element, such as a resistor, a capacitor and an inductor, a package structure or a combination thereof. In another embodiment, the second electronic component 32 is a semiconductor chip, and is disposed in a flip-chip manner via a plurality of conductive bumps 320, such as a solder material and metal pillars, on a circuit layer of the carrier structure 30 and electrically connected to the circuit layer, and an underfill 31 encapsulates the conductive bumps 320. In yet another embodiment, the second electronic component 32 is electrically connected to the circuit layer of the carrier structure 30 in a wire bonding manner via a plurality of bonding wires. In still another embodiment, the second electronic component 32 is in direct contact with the circuit layer of the carrier structure 30. In a further embodiment, the second electronic component 32 is electrically connected to the carrier structure 30 in other manners.

The second electronic component 32 is provided with at least one set of clock and data recovery circuit (CDR) corresponding to the optical communication element 26, for providing recover or dismantle signals of the same clock for a serial communication technique of SERializer/DESerializer (SERDES) and act as high bandwidth transmission contacts (I/Os).

The third electronic component 33 is disposed on the lower surface 30b of the carrier structure 30. In an embodiment, the third electronic component 33 is an active element, such as a semiconductor chip, a passive element, such as a resistor, a capacitor and an inductor, a package structure, or a combination thereof. In another embodiment, the third electronic component 33 is a semiconductor chip, and disposed in a flip-chip manner via a plurality of conductive bumps 330, such as a solder material and metal pillars, on the circuit layer of the carrier structure 30 and electrically connected to the circuit layer, and an underfill 31 encapsulates the conductive bumps 330. In yet another embodiment, the third electronic component 33 is electrically connected to the circuit layer of the carrier structure 30 in a wire bonding manner via a plurality of bonding wires. In still another embodiment, the third electronic component 33 is in direct contact with the circuit layer of the carrier structure 30. In a further embodiment, the third electronic component 33 is electrically connected to the carrier structure 30 in other manners.

In an embodiment, the third electronic component 33 is provided with a power management IC for managing power of a main system.

The heat sink 34 is bonded via the heat dissipating layer 35 to the second electronic component 32. In an embodiment, the heat dissipating layer 35 is a thermal interface material (TIM), such as a highly thermally conductive metal resin. The heat sink 34 has a heat dissipating body 340 and at least one supporting leg 341 disposed on a lower side of the heat dissipating body 340. The heat dissipating body 340 is in the form of a heat dissipating plate, and the lower side of the heat dissipating body 340 is in contact with the heat dissipating layer 35. The supporting leg 341 is bonded via an adhesion layer 36 to the upper surface 30a of the carrier structure 30.

The present disclosure also provides an electronic package 2, 3, which comprises an encapsulation layer 25, at least one first electronic component 21, a plurality of conductive pillars 23, a circuit structure 20, and at least one optical communication element 26.

The encapsulation layer 25 has a first surface 25a, a second surface 25b opposing the first surface 25a, and a lateral surface 25c adjacent to the first and second surfaces 25a and 25b.

The first electronic component 21 is embedded in the encapsulation layer 25. A plurality of conductors 22 are bonded and electrically connected to the first electronic component 21. The conductors 22 is embedded in the protection film 211, and the end surfaces 22a of the conductors 22 are exposed from the first surface 25a of the protection film 211.

The conductive pillars 23 is embedded in the encapsulation layer 25, and the end surfaces 23a of the conductive pillars 23 are exposed from the first surface 25a of the encapsulation layer 25.

The circuit structure 20 is disposed on the first surface 25a of the encapsulation layer 25 and electrically connected to the conductive pillars 23 and the conductors 22.

The optical communication element 26 is disposed on and electrically connected to the circuit structure 20, and has an opto-electronic part 26a and a laser part 26b.

In an embodiment, the opto-electronic part 26a converts an optical signal into an electric signal, and the laser part 26b converts the electric signal into another optical signal and emits the another optical signal. In another embodiment, the optical communication element 26 is electrically connected to the circuit structure 20 via a plurality of conductive bumps 27 that are disposed outside the laser part 26b. In yet another embodiment, a packaging material 29 encapsulates the plurality of conductive bumps 27, and is not formed on the laser part 26b.

In an embodiment, the optical communication element 26 protrudes from the lateral surface 25c of the encapsulation layer 25.

In an embodiment, the electronic package 2, 3 further comprises a circuit part 240 disposed on the second surface 25b of the encapsulation layer 25 and electrically connected to the conductive pillars 23. In another embodiment, a plurality of conductive elements 24 are disposed on the circuit part 240.

In an embodiment, the electronic package 3 further comprises a carrier structure 30 disposed on the second surface 25b of the encapsulation layer 25. In another embodiment, at least one second electronic component 32 is disposed on the carrier structure 30.

In the electronic package and the method for fabricating the same according to the present disclosure, the encapsulation layer has the removal region. Therefore, the functions of the optical communication element will not be affected in a polishing process or by the packaging material, and the present disclosure is advantageous for the operation of the optical communication element.

The foregoing descriptions of the detailed embodiments are only illustrated to disclose the features and functions of the present disclosure and not restrictive of the scope of the present disclosure. It should be understood to those in the art that all modifications and variations according to the spirit and principle in the present disclosure should fall within the scope of the appended claims.

What is claimed is:

1. An electronic package, comprising:
   an encapsulation layer having a first surface, a second surface opposing the first surface, and a lateral surface adjacent to the first surface and the second surface;
   a first electronic component embedded in the encapsulation layer;
   a plurality of conductive pillars embedded in the encapsulation layer;
   a circuit structure disposed on the first surface of the encapsulation layer and electrically connected to the conductive pillars and the first electronic component; and
   an optical communication element disposed on the circuit structure and electrically connected to the circuit structure,
   wherein the optical communication element has an opto-electronic part and a laser part.

2. The electronic package of claim 1, wherein the first electronic component is bonded and electrically connected to a plurality of conductors.

3. The electronic package of claim 1, wherein the opto-electronic part converts an optical signal into an electric signal, and the laser part converts the electric signal into another optical signal and emits the another optical signal.

4. The electronic package of claim 3, wherein the optical communication element is electrically connected to the circuit structure via a plurality of conductive bumps disposed outside the laser part.

5. The electronic package of claim 4, further comprising a packaging material packaging the plurality of conductive bumps and free from being formed on the laser part.

6. The electronic package of claim 1, wherein the optical communication element has a protruding portion protruding from the lateral surface of the encapsulation layer and acting as a connecting segment.

7. The electronic package of claim 1, further comprising a circuit part disposed on the second surface of the encapsulation layer and electrically connected to the conductive pillars.

8. The electronic package of claim 7, further comprising a plurality of conductive elements disposed on the circuit part.

9. The electronic package of claim 1, further comprising a carrier structure disposed on the second surface of the encapsulation layer.

10. The electronic package of claim 9, further comprising a second electronic component disposed on the carrier structure.

11. A method for fabricating an electronic package, comprising:
   encapsulating a first electronic component and a plurality of conductive pillars with an encapsulation layer having a first surface and a second surface opposing the first surface and being defined with a reservation region and a removal region adjacent to the reservation region, wherein the first electronic component and a portion of the conductive pillars are disposed within the reservation region, and a remaining of the conductive pillars are disposed within the removal region;
   disposing a circuit structure on the first surface of the encapsulation layer, and electrically connecting the circuit structure to the conductive pillars and the first electronic component;
   disposing a circuit part on the second surface of the encapsulation layer, and electrically connecting the circuit part to the conductive pillars;
   removing the removal region and the circuit structure and the circuit part within the removal region, and forming a lateral surface of the encapsulation layer adjacent to the first surface and the second surface; and
   disposing on the circuit structure an optical communication element having an opto-electronic part and a laser part, and electrically connecting the optical communication element to the circuit structure.

12. The method of claim 11, wherein the first electronic component is bonded and electrically connected to a plurality of conductors.

13. The method of claim 11, wherein the plurality of conductive pillars surround the first electronic component before removing the removal region.

14. The method of claim 11, wherein the opto-electronic part converts an optical signal into an electric signal, and the laser part converts the electric signal into another optical signal and emits the another optical signal.

15. The method of claim 14, wherein the optical communication element is electrically connected to the circuit structure via a plurality of conductive bumps disposed outside the laser part.

16. The method of claim 15, further comprising packaging the plurality of conductive bumps with a packaging material free from being formed on the laser part.

17. The method of claim 11, wherein the optical communication element has a protruding portion protruding from the lateral surface of the encapsulation layer and acting as a connecting segment.

18. The method of claim 11, further comprising disposing a plurality of conductive elements on the circuit part.

19. The method of claim 11, further comprising disposing a carrier structure on the second surface of the encapsulation layer.

20. The method of claim 19, further comprising disposing a second electronic component on the carrier structure.

* * * * *